(12) United States Patent
van Dal et al.

(10) Patent No.: US 11,791,395 B2
(45) Date of Patent: Oct. 17, 2023

(54) FERROELECTRIC FIELD EFFECT TRANSISTOR

(71) Applicant: Taiwan Semiconductor Manufacturing Co., Ltd., Hsinchu (TW)

(72) Inventors: Marcus Johannes Henricus van Dal, Linden (BE); Gerben Doornbos, Kessel-Lo (BE); Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/873,825

(22) Filed: Jul. 26, 2022

(65) Prior Publication Data

US 2022/0367666 A1  Nov. 17, 2022

Related U.S. Application Data

(62) Division of application No. 16/888,349, filed on May 29, 2020.

(51) Int. Cl.
*H01L 29/51* (2006.01)
*H01L 29/66* (2006.01)
*H01L 29/78* (2006.01)
*H01L 21/28* (2006.01)

(52) U.S. Cl.
CPC ...... *H01L 29/516* (2013.01); *H01L 29/40111* (2019.08); *H01L 29/517* (2013.01); *H01L 29/6684* (2013.01); *H01L 29/78391* (2014.09)

(58) Field of Classification Search
CPC .......... H01L 29/516; H01L 29/6684; H01L 29/78391; H01L 29/40111; H01L 29/517
USPC .......................................................... 257/295
See application file for complete search history.

(56) References Cited

U.S. PATENT DOCUMENTS

| 6,574,131 B1 * | 6/2003 | Sailing | ................ G11C 11/22 257/295 |
| 6,876,022 B2 * | 4/2005 | Sailing | .......... H01L 29/78391 257/295 |
| 2003/0207470 A1 * | 11/2003 | Azuma | ................ C30B 7/00 257/E21.011 |

(Continued)

OTHER PUBLICATIONS

S. Fichtner, Niklas Wolff, Gnanavel Krishnamurthy, Adrian Petraru, Sascha Bohse, Fabian Lofink, Steffen Chemnitz, Hermann Kohlstedt, Lorenz, Kienle, and Bernhard Wagner, Identifying and overcoming the interface originating c-axis instability in highly Sc enhanced AlN for piezoelectric microelectromechanical systems, J. Appl. Phys. 122, 035301 (2017); https://doi.org/10.1063/1.4993908.

(Continued)

*Primary Examiner* — Sheikh Maruf
(74) *Attorney, Agent, or Firm* — HAYNES AND BOONE, LLP

(57) ABSTRACT

Semiconductor devices and methods of forming the same are provided. A semiconductor device according to the present disclosure includes a first gate electrode, a ferroelectric insulating layer over the first gate electrode, a semiconductor member over the ferroelectric insulating layer, a gate dielectric layer over the semiconductor member, and a second gate electrode over the gate dielectric layer.

20 Claims, 16 Drawing Sheets

(56) References Cited

U.S. PATENT DOCUMENTS

| | | | | |
|---|---|---|---|---|
| 2005/0213282 A1* | 9/2005 | Kondo | H01L 29/40111 | 257/E29.164 |
| 2009/0261395 A1* | 10/2009 | Boescke | H01L 21/02194 | 257/295 |
| 2010/0140589 A1* | 6/2010 | Ionescu | H01L 29/78391 | 257/295 |
| 2012/0007158 A1* | 1/2012 | Yoon | H01L 29/516 | 257/295 |
| 2012/0086059 A1* | 4/2012 | Dubourdieu | H01L 21/823412 | 257/295 |
| 2014/0070290 A1* | 3/2014 | Inumiya | H10B 51/20 | 257/295 |
| 2015/0171183 A1* | 6/2015 | Sakai | H01L 21/28194 | 257/295 |
| 2015/0310905 A1* | 10/2015 | Karda | G11C 16/0466 | 257/295 |
| 2015/0357429 A1* | 12/2015 | Dubourdieu | H01L 29/513 | 257/295 |
| 2015/0380511 A1* | 12/2015 | Irsigler | H01L 29/78391 | 257/295 |

OTHER PUBLICATIONS

S. Fichtner, Niklas Wolff, Fabian Lofink, Lorenz, Kienle, and Bernhard Wagner, AlScN: A III-V semiconductor based ferroelectric, J. Appl. Phys. 125, 114103 (2019); https://doi.org/10.1063/1.5084945.

Siyuan Zhang, David Holec, Wai Yuen Fu, Colin J. Humphreys, and Michell A. Moram, Tunable optoelectronic and ferroelectric properties in Sc-based III-nitrides, J. Appl. Phys. 114, 133510 (2013); https://doi.org/10.1063.1.4824179.

Min Hyuk Park, Young Hwan Lee, Thomas Mikolajick, Uwe Schroeder and Cheol Seong Hwang, Review and perspective on ferroelectric HfO2-based thin films for memory applications, MRS Communications (2018), 8, 795-808; https://doi.org/10.1557/mrc.2018.175.

* cited by examiner

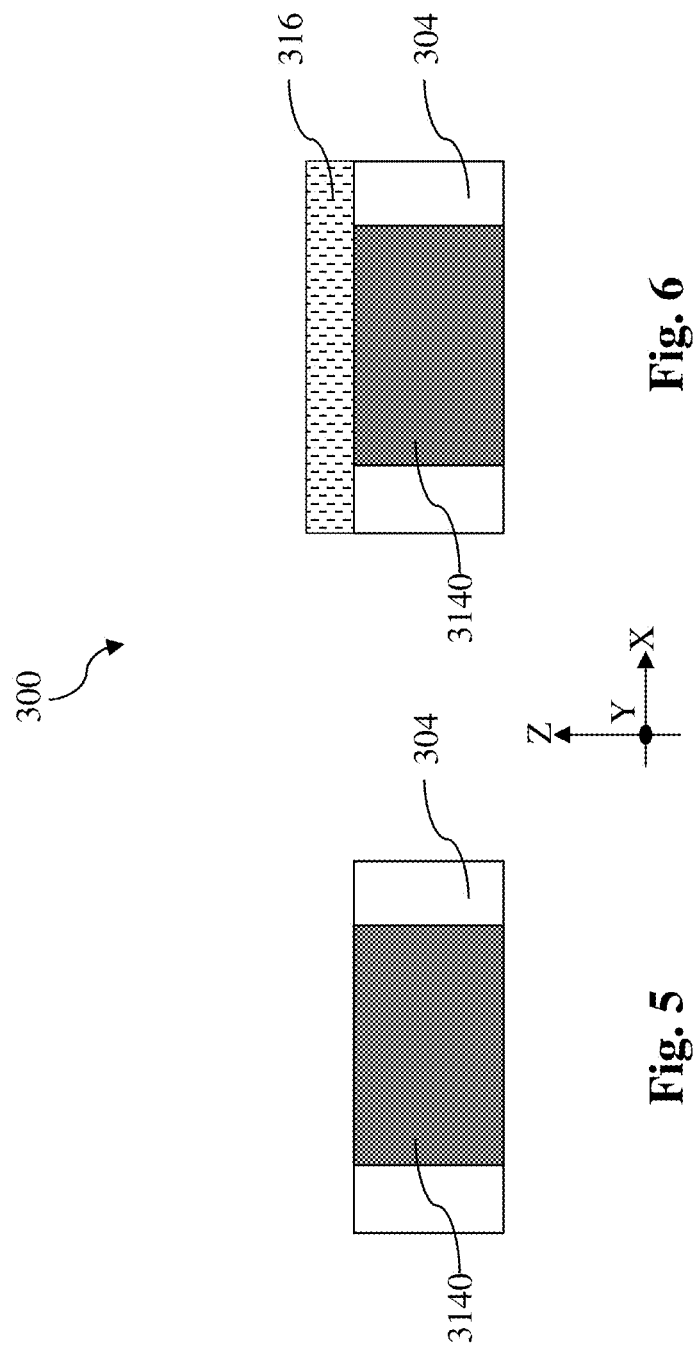

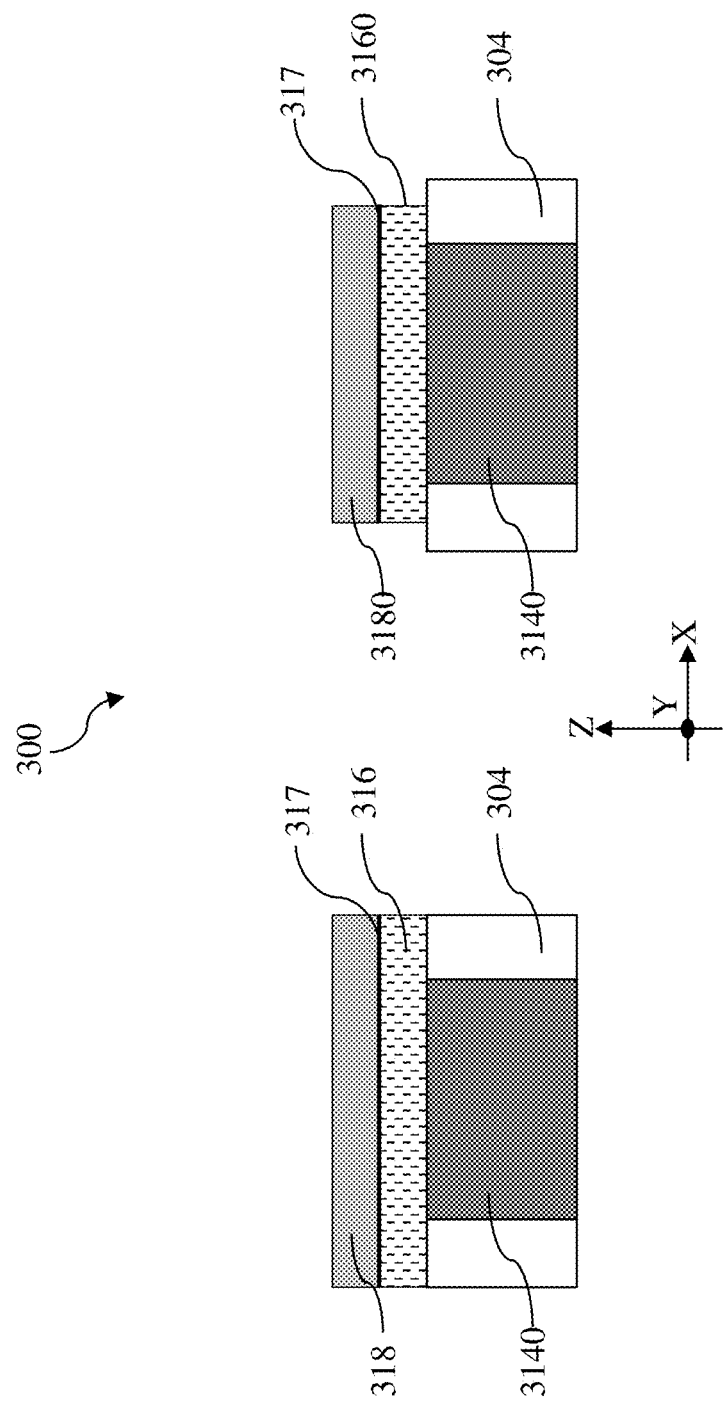

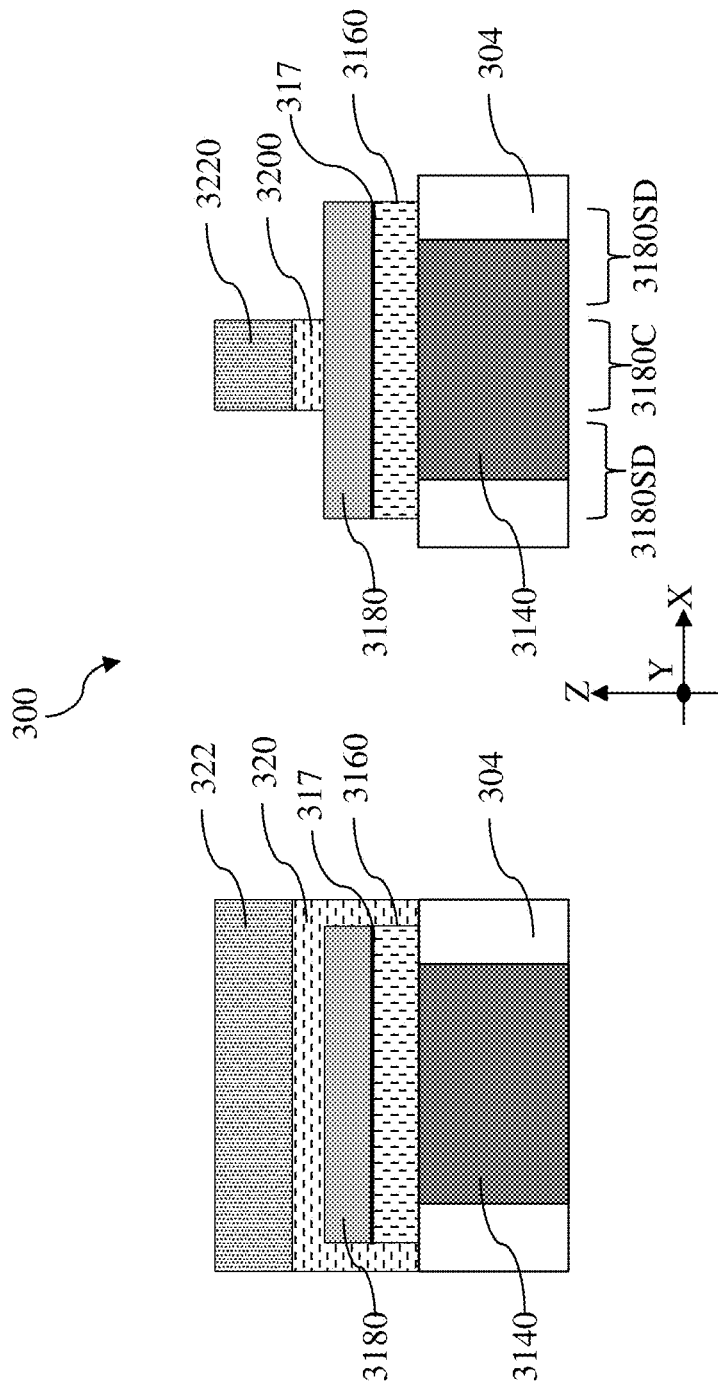

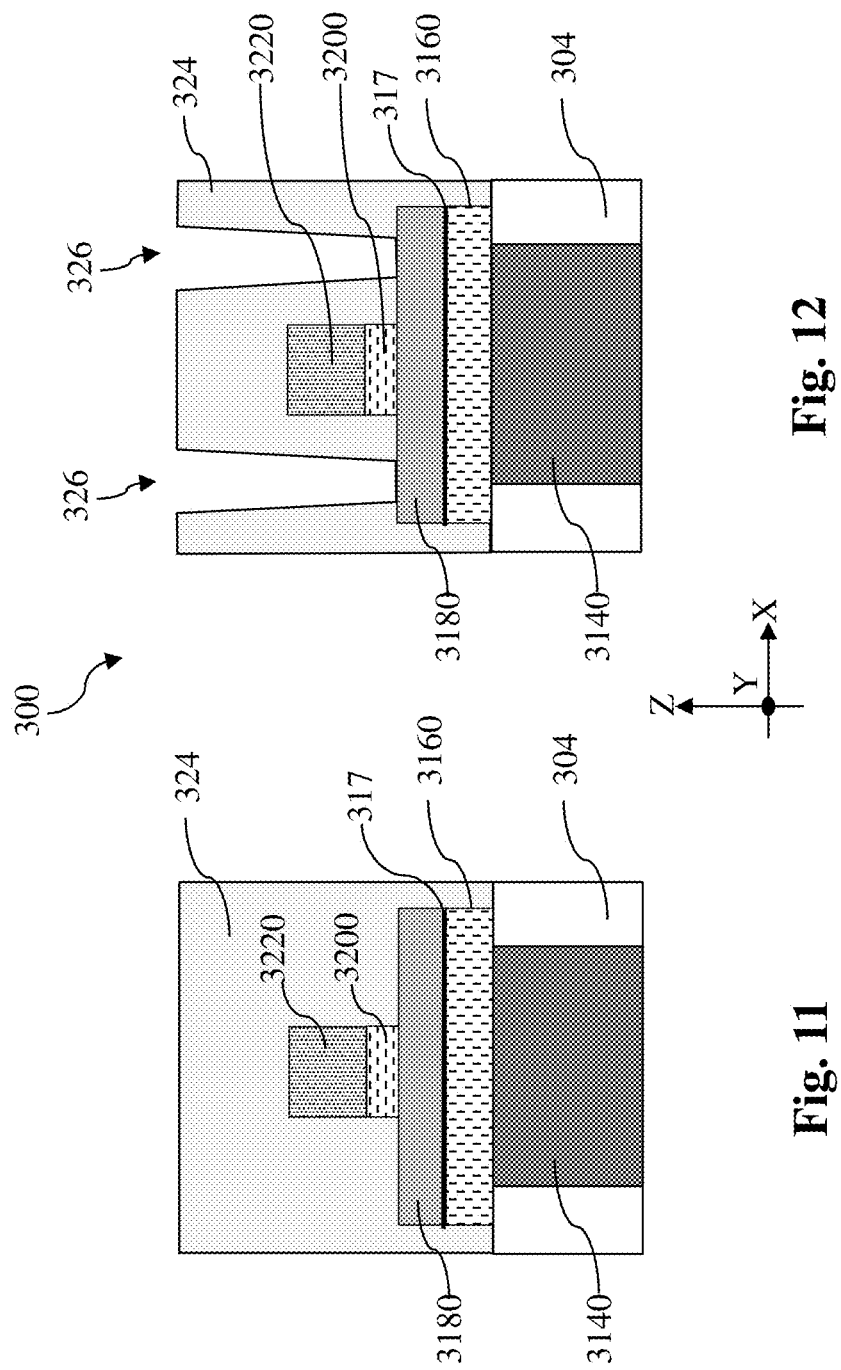

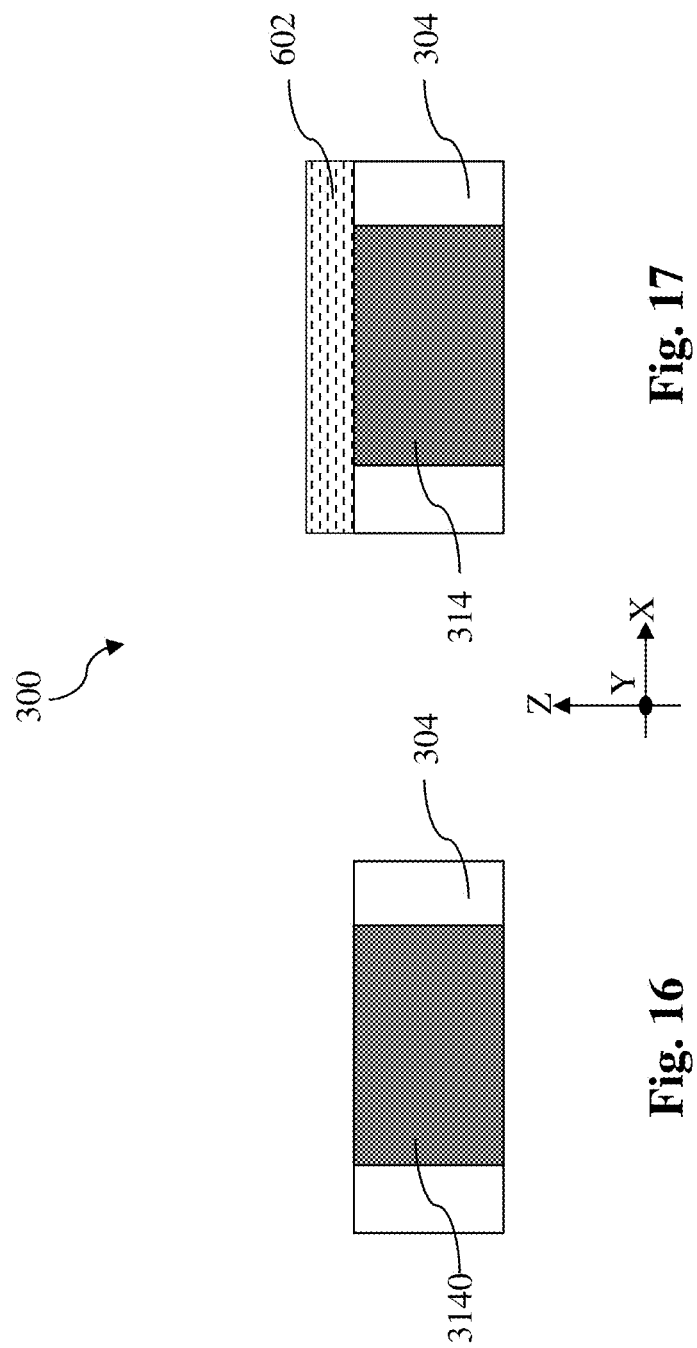

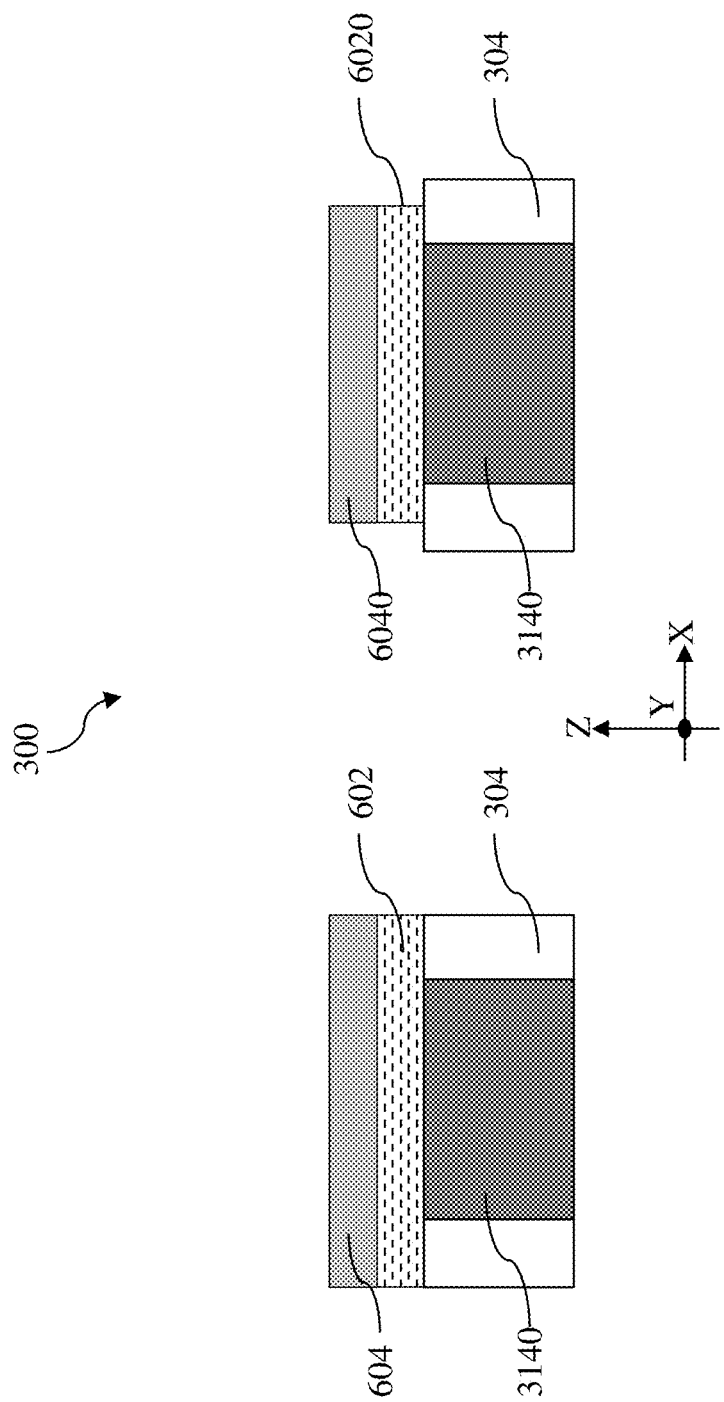

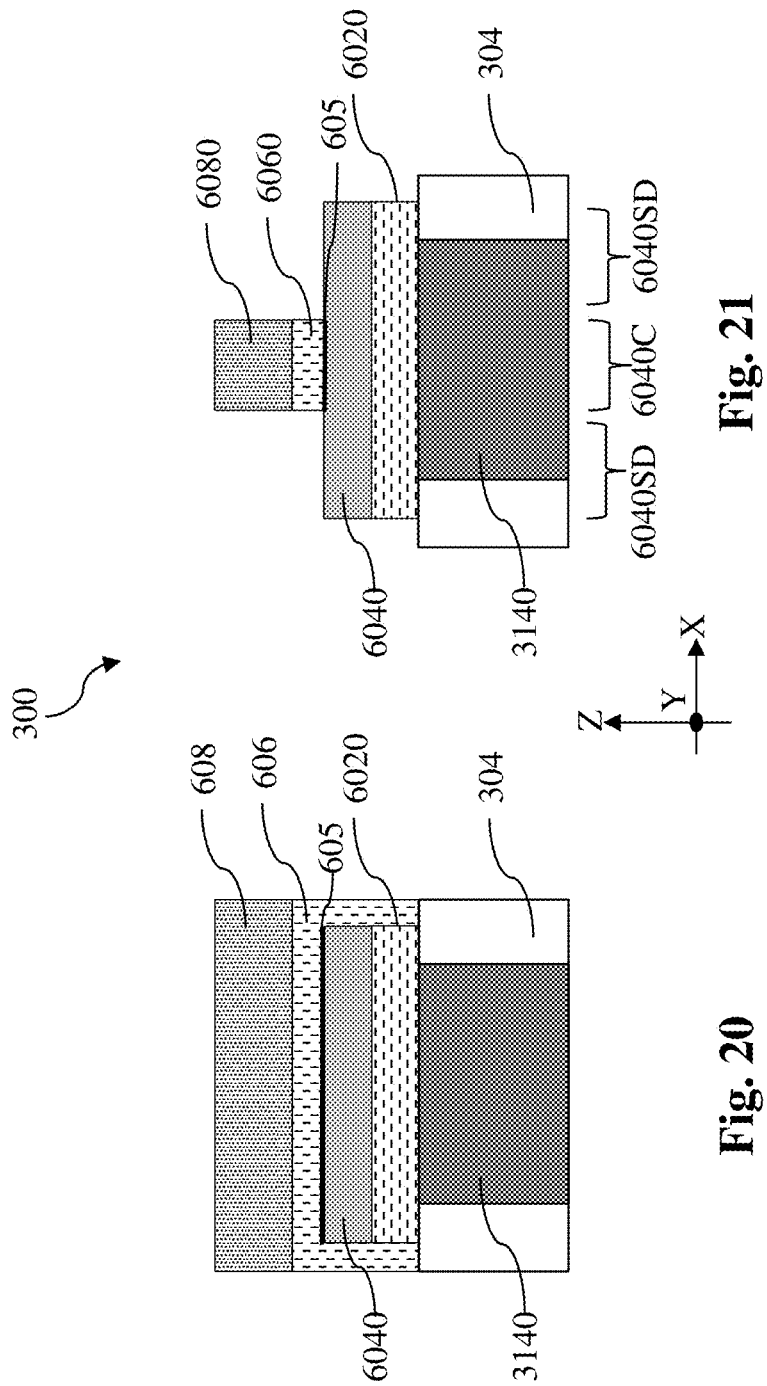

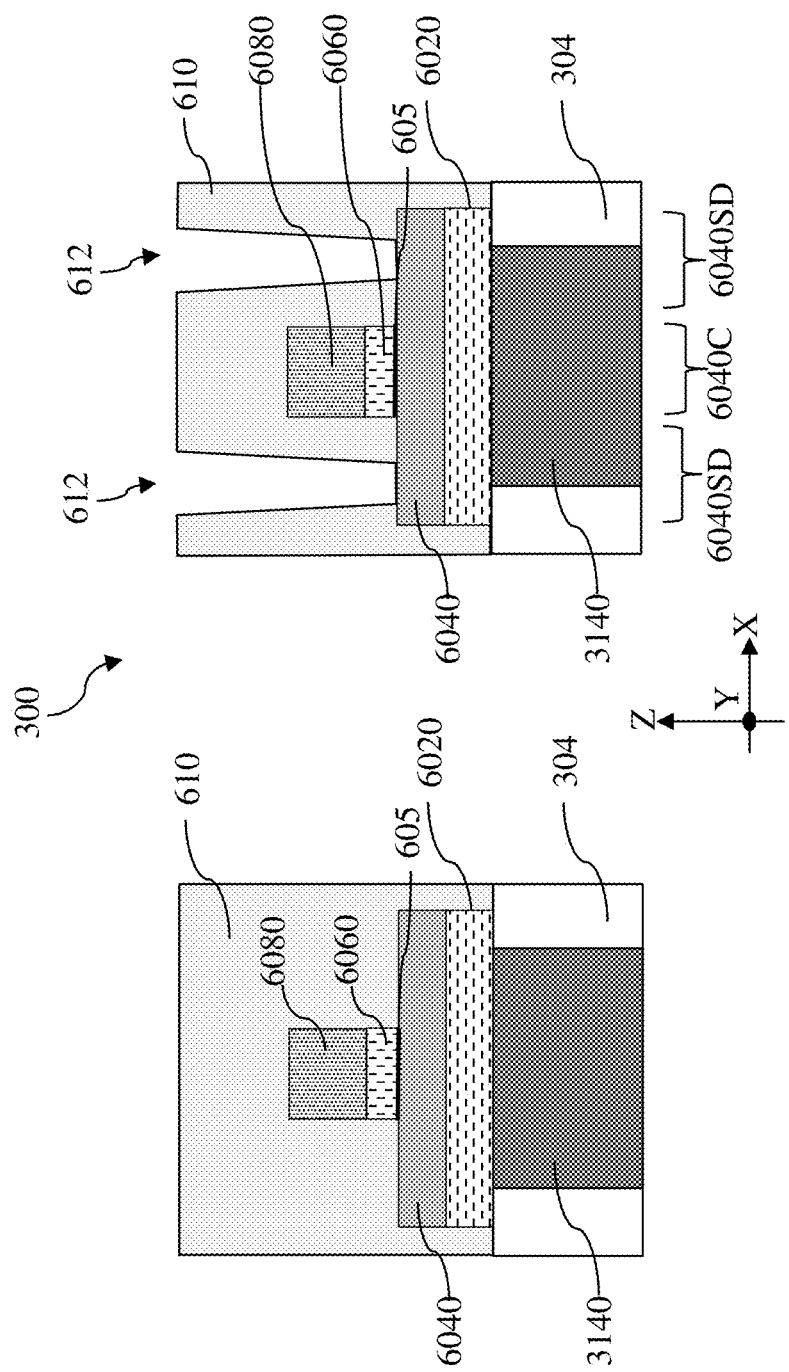

FERROELECTRIC FIELD EFFECT TRANSISTOR

PRIORITY

This is a divisional application of and claims priority to U.S. application Ser. No. 16/888,349, filed May 29, 2020, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, as a possible path for scaling down, peripheral devices and memory devices may be moved from front-end-of-line (FEOL) levels into higher interconnect levels, such as those in the back-end-of-line (BEOL) levels. Such memory devices include ferroelectric field effect transistors (FEFETs). In some examples, a FEFET includes a ferroelectric layer that is in contact with a high-k dielectric layer. As the gate trench shrinks in dimension, the introduction of the ferroelectric layer may pose additional challenges in scaling down FEFETs. In addition, the ferroelectric layer in the FEFET may not have sufficient thickness to have satisfactory cycle endurance. Therefore, although FEFETs have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4-13 are fragmentary cross-sectional views of an interconnect structure and a semiconductor device at various stages of a method, such as the method in FIG. 3, according to various aspects of the present disclosure.

FIGS. 16-24 are fragmentary cross-sectional views of a semiconductor device at various stages of a method, such as the method in FIG. 15, according to various aspects of the present disclosure.

DETAILED DESCRIPTION

Figure 1:
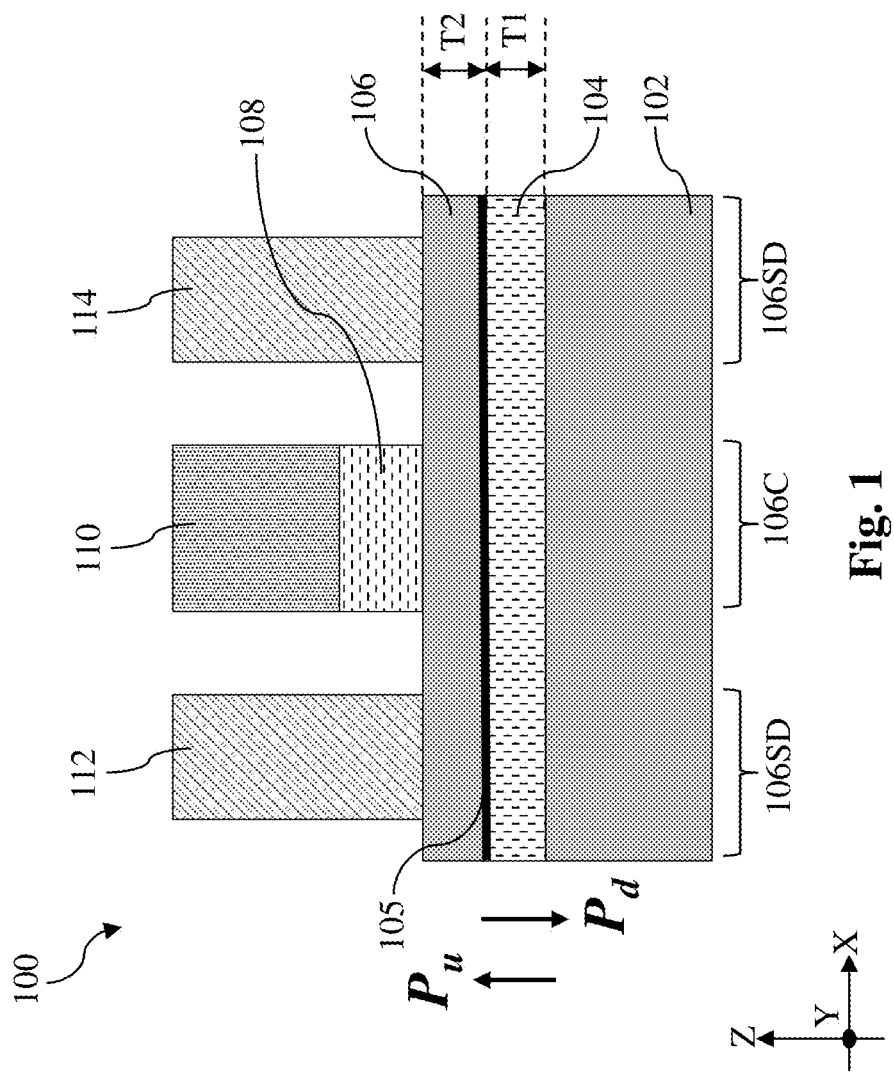
FIG. 1 illustrates a schematic cross-sectional view of a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a semiconductor device that includes a ferroelectric layer. More particularly, the present disclosure is related to semiconductor devices where a ferroelectric layer and a gate dielectric layer are separated by a semiconductor channel member.

Conventionally, memory devices are fabricated at the FEOL level. These memory devices may take up precious area at the FEOL level. The general wisdom has been to move the peripheral devices to the BEOL levels to make room for logic devices at the FEOL levels. Researches have been done to identify memory devices that are integratable with BEOL processes, are non-volatile, and have low power consumption. One of the front runners is a ferroelectric field effect transistor (FEFET) that has a ferroelectric layer. In some examples, the ferroelectric layer of a FEFET is disposed between the gate electrode and the channel. As a result, the ferroelectric layer of a FEFET comes in contact with the gate dielectric layer of the FEFET. With limited space in the gate trench, the ferroelectric layer literally competes for space with gate dielectric layer. Oftentimes the ferroelectric layer may not have good crystalline structure and sufficient thickness to have satisfactory cycle endurance. In order to make room for the ferroelectric layer, the gate dielectric layer in an FEFET may not have sufficient thickness. Overtime, the ferroelectric layer may lose its ferroelectricity or the gate dielectric layer may break down, resulting in failure of the FEFET.

The present disclosure provides a semiconductor device that has a ferroelectric layer separated from a gate dielectric layer by the channel. The ferroelectric layer is disposed between a first gate electrode and the channel while the gate dielectric layer is disposed between a second gate electrode and the channel. With separation of the ferroelectric layer and the gate dielectric layer, the ferroelectric layer and the gate dielectric layer no longer compete for space and semiconductor devices of the present disclosure may have satisfactory ferroelectric layer and gate dielectric layer at the same time. In addition, a semiconductor device of the present disclosure may have two gates, one of which is dedicated to WRITE operations and the other of which is dedicated to READ operations. Owing to the duality of gates, the semiconductor device of the present disclosure may be referred to as a backside ferroelectric field effect transistor (BSFFET). Structures and operations of a BSFFET are described below in conjunction with various embodiments of the present disclosure.

Reference is first made to FIG. 1, which illustrates a cross-sectional view of a first semiconductor device 100 according to various aspects of the present disclosure. The first semiconductor device 100 is a BSFFET. As shown in FIG. 1, the first semiconductor device 100 includes a first gate electrode 102, a ferroelectric layer 104 disposed over the first gate electrode 102, a semiconductor member 106 disposed over the ferroelectric layer 104, a gate dielectric layer 108 disposed over a channel region 106C of the semiconductor member 106, a second gate electrode 110 over the gate dielectric layer 108, a first source/drain contact 112 and a second source/drain contact 114 disposed over the source/drain regions 106SD of the semiconductor member 106. According to some embodiments of the present disclosure, the first gate electrode 102 may be formed of copper, ruthenium, or tungsten and may be a conductive feature in an interconnect structure. For example, the first gate electrode 102 may be a portion of a conductive line in an interconnect structure. The ferroelectric layer 104 may include hafnium zirconium oxide, gallium nitride, indium nitride, indium gallium nitride, aluminum scandium nitride, indium scandium nitride, gallium scandium nitride, barium titanate, or ruthenium scandate. When the ferroelectric layer 104 is formed of hafnium zirconium oxide, the ferroelectric layer 104 may be doped with aluminum (Al), silicon (Si), lutetium (Lu) or lanthanum (La). The semiconductor member 106 may be formed of silicon, gallium nitride, indium nitride, indium gallium nitride, indium gallium zinc oxide (IGZO), molybdenum disulfide, or tungsten diselenide. A composition of the gate dielectric layer 108 may be different from that of the ferroelectric layer 104. The gate dielectric layer 108 may be formed of hafnium oxide, silicon oxide, aluminum oxide, or other suitable high-k dielectric material. The second gate electrode 110 may be formed of tungsten, nickel, tantalum, titanium, aluminum, copper, cobalt, tantalum nitride, titanium nitride, ruthenium or other suitable conductive materials. The gate dielectric layer 108 and the second gate electrode 110 may be collectively referred to as a gate structure.

In some embodiments, the first gate electrode 102 may serve as a write gate and the second gate electrode 110 may serve as read gate. In an example WRITE operation, a negative write voltage may be applied to the first gate electrode 102 to induce a downward polarization ($P_d$) in the ferroelectric layer 104 and a positive write voltage may be applied to the first gate electrode 102 to induce an upward polarization ($P_u$) in the ferroelectric layer 104. The downward and upward polarizations are results of sheet immobile charge densities of opposite signs at the upper and lower interfaces of the ferroelectric layer 104. The immobile charges are resulted from charged oxygen atoms that physically move in response to the positive and negative write voltages. The downward polarization ($P_d$) and the upward polarization ($P_u$) may increase or lower the threshold voltage of the channel in the semiconductor member 106. When a read voltage is applied at the second gate electrode 110, the read voltage may or may not be sufficient to reach the threshold voltage as it has shifted by the polarization. The difference states allow a read of the data stored in the first semiconductor device 100. The induced polarization is bistable (i.e., stable unless a write voltage is applied). Once the downward polarization or the upward polarization is written into the ferroelectric layer 104, such polarization may retain in the ferroelectric layer 104 without further power consumption at the first gate electrode 102.

In some implementations, the write voltage is greater than the read voltage. In some instances, a magnitude of the write voltage (including the positive write voltage and the negative write voltage) may be between about 1 volt (V) and about 6 V while the read voltage may be between about 0.3 V and about 2 V. In these embodiments, to ensure good cycle endurance, the ferroelectric layer 104 includes a first thickness T1, which is between about 3 nanometer (nm) and about 100 nm. It has been observed that when the first thickness T1 is smaller than 3 nm, the ferroelectric layer 104 loses its ferroelectricity. As ferroelectricity is a bulk property, ferroelectricity of the ferroelectric layer 104 may increase with thickness. However, when the first thickness is more than 100 nm, it may become too thick for integration into modern-day devices. The semiconductor member 106 includes a second thickness T2, which is between about 2 nm and about 30 nm. According to the present disclosure, to ensure complete penetration of the electric field of the upward/downward polarization through the semiconductor member 106, the semiconductor member 106 is made to be thin. In this regard, the second thickness T2 of the semiconductor member 106 is smaller than the first thickness T1 of the ferroelectric layer 104.

In some embodiments represented in FIG. 1, the first semiconductor device 100 may include a capping layer 105 disposed between the ferroelectric layer 104 and the semiconductor member 106. The capping layer 105 may be formed of silicon oxide or aluminum oxide and functions to prevent the polarization in the ferroelectric layer 104 from impacting carrier mobility in the semiconductor member 106. The capping layer 105 is thinner than the gate dielectric layer 108. That is, the capping layer 105 does not have the thickness required to serve as a satisfactory gate dielectric layer. In some instances, the capping layer 105 may have a thickness between about 1 nm and about 3 nm.

Figure 2:
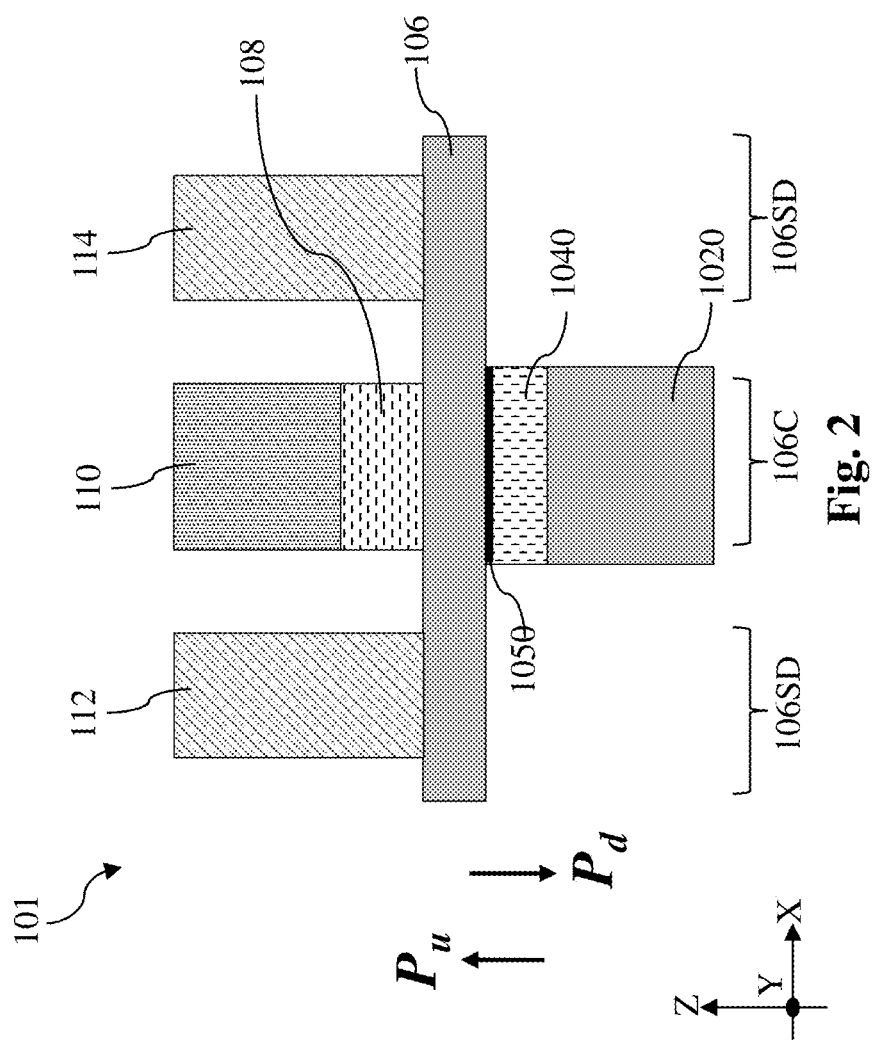
FIG. 2 illustrates a schematic cross-sectional view of another semiconductor device, according to various aspects of the present disclosure.

FIG. 2 illustrates a second semiconductor device 101. The second semiconductor device 101 includes a narrow first gate electrode 1020, a narrow ferroelectric layer 1040 over the narrow first gate electrode 1020, a semiconductor member 106 disposed over the narrow ferroelectric layer 1040, a gate dielectric layer 108 disposed over the channel region 106C, a second gate electrode 110 over the gate dielectric layer 108, a first source/drain contact 112 and a second source/drain contact 114 disposed over the source/drain region 106SD. As compared to the first semiconductor device 100 in FIG. 1, the narrow ferroelectric layer 1040 and the narrow first gate electrode 1020 are narrower than the semiconductor member 106 along the X direction. That is, both the narrow ferroelectric layer 1040 and the narrow first gate electrode 1020 are not coterminous with the overlying semiconductor member 106 along the X direction. In the depicted embodiment, the narrow ferroelectric layer 1040 and the narrow first gate electrode 1020 do not extend, along the X direction, into the source/drain regions 106SD or below the source/drain contacts 112 and 114. Like the first semiconductor device 100, the second semiconductor device 101 may also be a BSFFET and may also include a capping layer 105 between the narrow ferroelectric layer 1040 and the semiconductor member 106.

Figure 3:
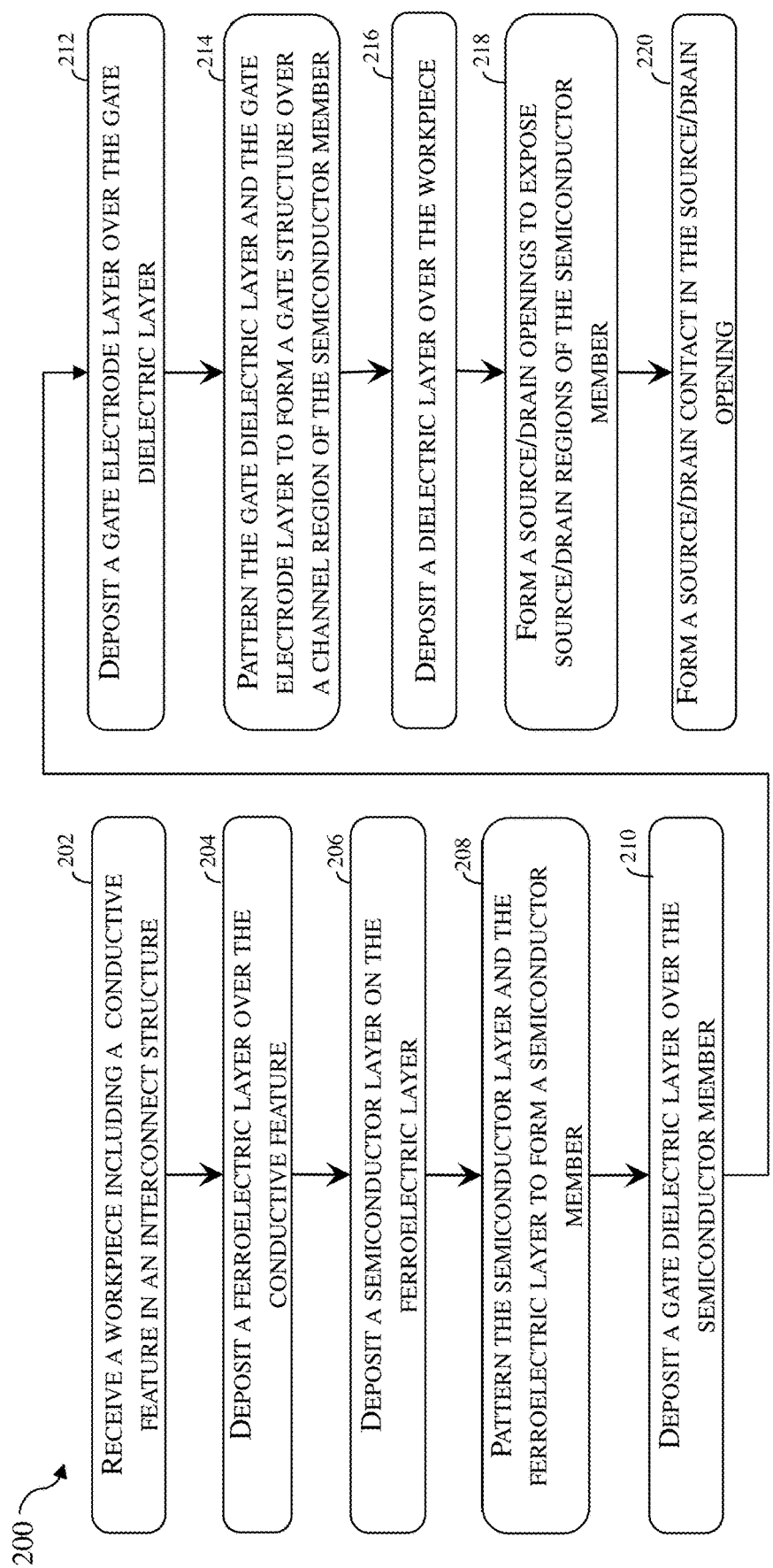
FIG. 3 is a flowchart of a method for fabricating a semiconductor device in FIG. 1 or 2, according to various aspects of the present disclosure.

FIG. 3 illustrates a flowchart of a method 200 for fabricating the first semiconductor device 100 in FIG. 1 or the second semiconductor device 101 in FIG. 2. Additional steps can be provided before, during, and after the method 200, and some of the steps described can be replaced or eliminated for other embodiments of the method 200. Operations of the method 200 may be better described in conjunction with FIGS. 4-13, which are fragmentary cross-sectional diagrammatic views of a workpiece 300 at various fabrication stages of a method, such as method 200 of FIG. 3. FIGS. 4-13 have been simplified for the sake of clarity to better understand the inventive concepts of the present disclosure. Additional features can be added in workpiece 300, and some of the features described below can be replaced, modified, or eliminated in other embodiments of workpiece 300.

Figure 4:
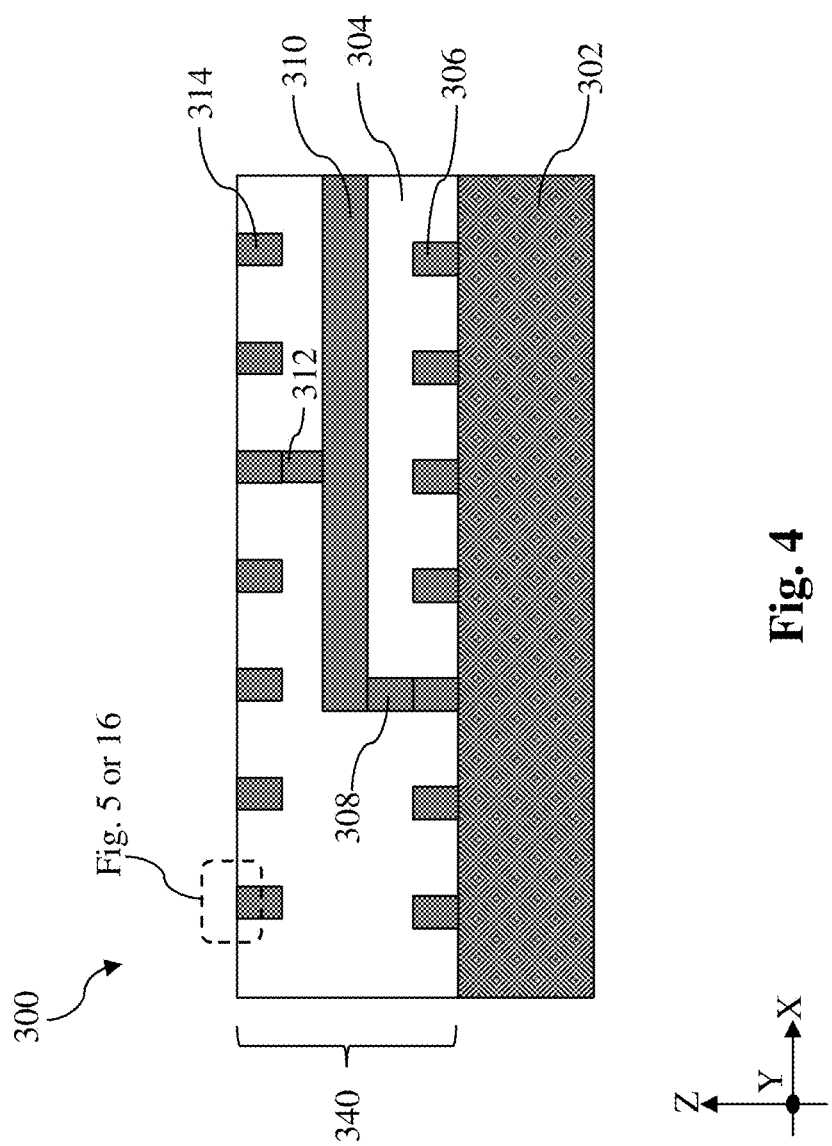

Referring to FIGS. 3, 4 and 5, method 200 includes a block 202 where a workpiece 300 is received. As shown in FIG. 4, the workpiece 300 may include a device substrate 302 and an interconnect structure 340 over the substrate. It is noted that the depiction of the device substrate 302 is simplified and does not include all the features envisioned by the present disclosure. For example, the device substrate 302 may include a semiconductor substrate and various fin-type field effect transistors (FinFETs), multi-bridge-channel (MBC) transistors (also known as gate-all-around (GAA) transistors, nanosheet transistors, nanowire transistors, or surrounding-gate transistors (SGTs)), and contacts connected thereto. The interconnect structure 340 includes one or more metal line layers (or conductive line layers or interconnect layers) and one or more contact vias. For example, the portion of the interconnect structure 340 in FIG. 4 includes a first metal line layer 306, a second metal line layer 310, and a third metal line layer 314. The metal line layers in the workpiece 300 may be electrically coupled by one or more contact vias. For example, a first contact via 308 may couple the first metal line layer 306 and the second metal line layer 310; and a second contact via 312 may couple the second metal line layer 310 and the third metal line layer 314. The foregoing metal line layers and the contact vias are embedded in an intermetal dielectric layer 304. While not depicted, the intermetal dielectric layer 304 may stand for multiple dielectric layers and etch stop layers that are formed at the interface between metal line layers. In some instances, the intermetal dielectric layer 304 may be formed of silicon oxide and the etch stop layer (not shown) may be formed of silicon nitride or silicon oxynitride.

For ease of illustration, the dotted rectangular area in FIG. 4 is enlarged and shown in FIG. 5. FIG. 5 shows a conductive feature 3140 in the third metal line layer 314. The conductive feature 3140 may be formed of copper, ruthenium, or tungsten and may be embedded in the intermetal dielectric layer 304. In FIG. 5, the intermetal dielectric layer 304 adjacent the conductive feature 3140 may be formed of silicon oxide.

Referring to FIGS. 3 and 6, method 200 includes a block 204 where a ferroelectric layer 316 is deposited over the conductive feature 3140. In some embodiments, the ferroelectric layer 316 may include hafnium zirconium oxide, gallium nitride, indium nitride, indium gallium nitride, aluminum scandium nitride, indium scandium nitride, gallium scandium nitride, barium titanate, ruthenium scandate, or other suitable ferroelectric material. In some embodiments, the ferroelectric layer 316 may be deposited directly on the workpiece 300 using atomic layer deposition (ALD), physical vapor deposition (PVD), or chemical vapor deposition (CVD). In some alternative embodiments, an interfacial layer is first deposited on the workpiece 300 and then the ferroelectric layer 316 may be deposited epitaxially on the interfacial layer. For example, when the ferroelectric layer 316 is formed of gallium nitride, an aluminum oxide interfacial layer may be first deposited on the workpiece 300 and then gallium nitride may be deposited on the aluminum oxide interfacial layer using molecular beam epitaxy (MBE), vapor phase epitaxy (VPE), or metalorganic CVD (MOCVD) to form the ferroelectric layer 316. In still some embodiments, the ferroelectric layer 316 may be deposited on a carrier substrate first and then transferred to the workpiece 300. For example, the ferroelectric layer 316 may be epitaxially grown on a silicon carrier substrate or a sapphire carrier substrate, flipped over, bonded to the workpiece 300, and then separated from the carrier substrate. In some implementations, the ferroelectric layer 316 may be formed to a thickness between about 3 nm and about 100 nm. The ferroelectric layer 316 exhibits ferroelectricity.

Referring to FIGS. 3 and 7, method 200 includes a block 206 where a semiconductor layer 318 is deposited over the ferroelectric layer 316. In some embodiments, the semiconductor layer 318 may include silicon, gallium nitride, indium nitride, indium gallium nitride, indium gallium zinc oxide (IGZO), molybdenum disulfide, tungsten diselenide, or other suitable semiconductor material. In some implementations, the semiconductor layer 318 may be deposited using ALD or CVD. In some alternative implementations where a lattice mismatch between the semiconductor layer 318 and the ferroelectric layer 316 allows for epitaxial growth, the semiconductor layer 318 may be epitaxially grown on the ferroelectric layer 316. The semiconductor layer 318 does not exhibit ferroelectricity. In some embodiments, the semiconductor layer 318 may be formed to a thickness between about 2 nm and about 30 nm. In some embodiments, a capping layer 317 is deposited on the ferroelectric layer 316 before the deposition of the semiconductor layer 318. The capping layer 317 may be formed of silicon oxide or aluminum oxide and may be deposited using CVD or ALD.

Referring to FIGS. 3 and 8, method 200 includes a block 208 where the semiconductor layer 318 and the ferroelectric layer 316 are patterned to form a semiconductor member 3180. Operations at block 208 may include photolithography processes and etch processes. In an example photolithography process, a hard mask may be deposited over the semiconductor layer 318. A photoresist layer is then deposited over the hard mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the hard mask layer. Then the semiconductor layer 318 and the ferroelectric layer 316 are etched in an etch process using the patterned hard mask as an etch mask. In some instances, the etch process may be a dry etch process, such as a reactive ion etching (RIE) process. After the etch process, the semiconductor layer 318 and the ferroelectric layer 316 are patterned into a semiconductor member 3180 and a ferroelectric feature 3160, respectively, as shown in FIG. 8. In the depicted embodiment, the semiconductor member 3180 and the ferroelectric feature 3160 are wider (along the X direction) than the underlying conductive feature 3140. This width arrangement corresponds to that in the second semiconductor device 101 in FIG. 2. In other embodiments, the semiconductor member 3180 and the ferroelectric feature 3160 may be substantially coterminous with the underlying conductive feature 3140 along the X direction. This latter width arrangement corresponds to that in the first semiconductor device 100 in FIG. 1. In embodiments where the capping layer 317 is formed, the capping layer 317 is also patterned at block 208.

Referring to FIGS. 3 and 9, method 200 includes a block 210 where a gate dielectric layer 320 is deposited over the semiconductor member 3180. In some embodiments, the gate dielectric layer 320 may include hafnium oxide, silicon oxide, aluminum oxide, or other suitable high-k dielectric material. In one embodiment, the gate dielectric layer 320 may include a silicon oxide layer to interface the semiconductor member 3180 and a hafnium oxide layer on the silicon oxide layer. The gate dielectric layer 320 may be deposited using ALD or CVD. In some embodiments, the gate dielectric layer 320 does not exhibit ferroelectricity. A composition of gate dielectric layer 320 may be different from a composition of the ferroelectric layer 316.

Referring to FIGS. 3 and 9, method 200 includes a block 212 where a gate electrode layer 322 is deposited on the gate dielectric layer 320. In some embodiments, the gate electrode layer 322 may include tungsten, nickel, tantalum, titanium, aluminum, copper, cobalt, tantalum nitride, titanium nitride, ruthenium or other suitable conductive materials. The gate electrode layer 322 may be deposited using PVD, CVD, or MOCVD.

Referring to FIGS. 3 and 10, method 200 includes a block 214 where the gate electrode layer 322 and the gate dielectric layer 320 are patterned to form a gate electrode 3220 over a channel region of the semiconductor member 3180. Operations at block 214 may include photolithography processes and etch processes. In an example photolithography process, a hard mask may be deposited over the gate electrode layer 322. A photoresist layer is then deposited over the hard mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the hard mask layer. Then the gate electrode layer 322 and the gate dielectric layer 320 are etched in an etch process using the patterned hard mask as an etch mask. In some instances, the etch process may be a dry etch process, such as a reactive ion etching (RIE) process. After the etch process, the gate electrode layer 322 and the gate dielectric layer 320 are patterned into a gate electrode 3220 and a gate dielectric feature 3200, respectively, as shown in FIG. 10. The gate electrode 3220 and the gate dielectric feature 3200 are disposed in a channel region 3180C of the semiconductor member 3180. The channel region 3180C are disposed between two source/drain regions 3180SD. The gate electrode 3220 and the gate dielectric feature 3200 may be collectively referred to as a gate structure.

Referring to FIGS. 3 and 11, method 200 includes a block 216 where a dielectric layer 324 is deposited over the workpiece 300. In some embodiments, the dielectric layer 324 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), silicon oxide, and/or other suitable dielectric materials. The dielectric layer 324 may be deposited by spin-on coating or CVD. In some embodiments not explicitly shown, a dielectric barrier layer may be conformally deposited on to surfaces and/or sidewalls of the gate electrode 3220, the gate dielectric feature 3200, the semiconductor member 3180, and the ferroelectric feature 3160 before deposition of the dielectric layer 324. The dielectric barrier layer functions to maintain the integrity of the gate electrode 3220 by preventing oxygen diffusion into the gate electrode 3220 or metal out diffusion into the dielectric layer 324. Like the intermetal dielectric layer 304, the dielectric layer 324 is also an intermetal dielectric (IMD) layer as further metal layers of the interconnect structure 340 may be formed over the dielectric layer 324.

Referring to FIGS. 3 and 12, method 200 includes a block 218 where a source/drain opening 326 are formed in the dielectric layer 324 to expose a source/drain region 3180SD of the semiconductor member 3180. Operations at block 218 may include photolithography processes and etch processes. In an example photolithography process, a hard mask may be deposited over the dielectric layer 324. A photoresist layer is then deposited over the hard mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the hard mask layer. Then the dielectric layer 324 is anisotropically etched in an etch process using the patterned hard mask as an etch mask to form the source/drain openings 326. In some instances, the etch process may be a dry etch process, such as a reactive ion etching (RIE) process. While not explicitly shown, operations at block 218 may be combined with formation of contact via openings to other conductive features in the third metal line layer 314 shown in FIG. 4.

Figure 13:
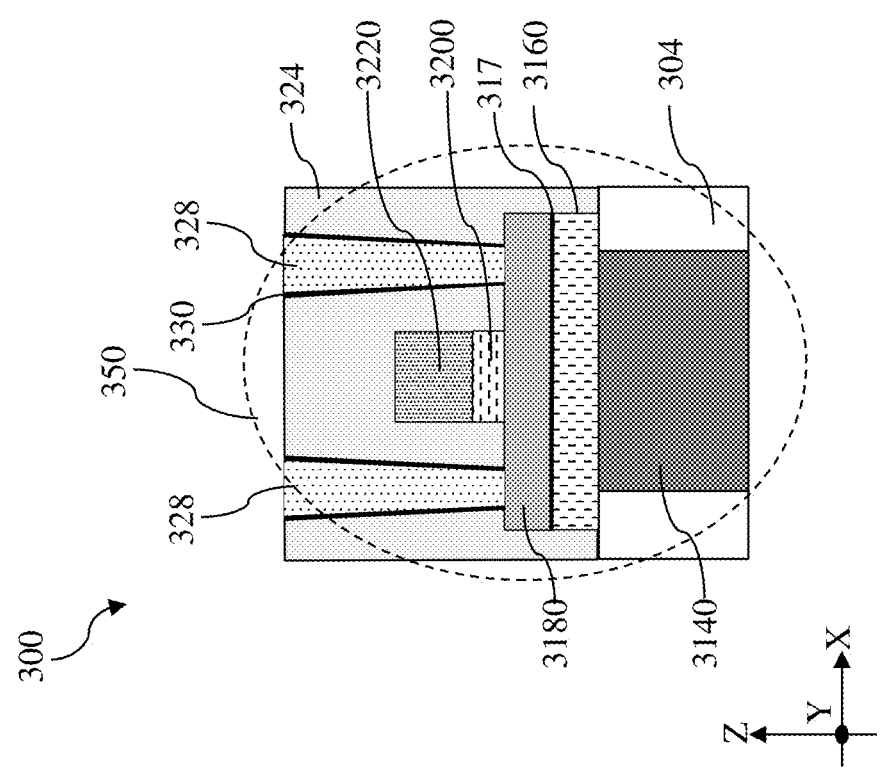

Referring to FIGS. 3 and 13, method 200 includes a block 220 where a source/drain contact 328 is formed in the source/drain opening 326. In some embodiments, the source/drain contact 328 may include tungsten, nickel, tantalum, titanium, aluminum, copper, cobalt, tantalum nitride, titanium nitride, ruthenium or other suitable conductive materials. The source/drain contact 328 may be formed using PVD or a combination of PVD and electroplating or PVD and electroless plating. In the embodiments represented in FIG. 13, the source/drain contact 328 may be isolated from the dielectric layer 324 by a barrier layer 330. The barrier layer 330 may be formed of tantalum, tantalum nitride, tantalum carbide, titanium, titanium nitride, titanium carbide, and other suitable material that can block oxygen diffusion. While not explicitly shown, in some implementations, a silicide feature may be formed at the interface between the source/drain contact 328 and the semiconductor member 3180. The silicide feature is formed by depositing a metal layer on the source/drain regions 3180SD exposed in the source/drain openings 326. The metal layer includes any material suitable for promoting silicide formation, such as nickel, titanium, cobalt, tantalum, other suitable metal, or combinations thereof. The workpiece 300 is then heated (for example, subjected to an annealing process) to cause a silicidation reaction between with the metal and the semiconductor member 3180. The silicide layer may include nickel silicide, titanium silicide, tantalum silicide, or cobalt silicide. Any un-reacted metal, such as remaining portions of the metal layer, is selectively removed by any suitable process, such as an etching process.

Reference is still made to FIG. 13, upon conclusion of the operations at block 220, a first BSFFET 350 is substantially formed. Depending on whether the semiconductor member 3180 and the ferroelectric feature 3160 is coterminous with the conductive feature 3140, the first BSFFET 350 may correspond to the first semiconductor device 100 in FIG. 1 or the second semiconductor device 101 in FIG. 2. For example, the gate dielectric feature 3200 may correspond to the gate dielectric layer 108 in FIG. 1 or FIG. 2; and the ferroelectric feature 3160 may correspond to the ferroelectric layer 104 in FIG. 1 or the narrow ferroelectric layer 1040 in FIG. 2. Because the operation of the first BSFFET 350 is similar to that of the first semiconductor device 100 or the second semiconductor device 101, description of the operations of the first BSFFET 350 is omitted for brevity.

In some alternative embodiments, the ferroelectric layer and the gate dielectric layer may switch place but are still separated from one another by the semiconductor member where the channel is formed. An example is the third semiconductor device 400 in FIG. 14. The third semiconductor device 400 includes a back gate electrode 402, a back gate dielectric layer 408 disposed over the back gate electrode 402, a semiconductor member 406 disposed over the back gate dielectric layer 408, a front ferroelectric layer 404 disposed over a channel region 406C of the semiconductor member 406, a front gate electrode 410 over the front ferroelectric layer 404, a first source/drain contact 412 and a second source/drain contact 414 disposed over the source/drain regions 406SD. According to some embodiments of the present disclosure, the back gate electrode 402 may be formed of copper or tungsten and may be a conductive feature in an interconnect structure. The front ferroelectric layer 404 may include hafnium zirconium oxide, gallium nitride, indium nitride, indium gallium nitride, aluminum scandium nitride, indium scandium nitride, gallium scandium nitride, barium titanate, or ruthenium scandate. When the front ferroelectric layer 404 is formed of hafnium zirconium oxide, the front ferroelectric layer 404 may be doped with aluminum (Al), silicon (Si), lutetium (Lu) or lanthanum (La). The semiconductor member 406 may be formed of silicon, gallium nitride, indium nitride, indium gallium nitride, indium gallium zinc oxide (IGZO), molybdenum disulfide, or tungsten diselenide. A composition of the back gate dielectric layer 408 may be different from that of the front ferroelectric layer 404. The back gate dielectric layer 408 may be formed of hafnium oxide, silicon oxide, or aluminum oxide. The front gate electrode 410 may be formed of tungsten, nickel, tantalum, titanium, aluminum, copper, cobalt, tantalum nitride, titanium nitride, ruthenium or other suitable conductive materials.

In some embodiments, the front gate electrode 410 may serve as a write gate and the back gate electrode 402 may serve as read gate. In an example WRITE operation, a positive write voltage may be applied to the front gate electrode 410 to induce a downward polarization ($P_d$) in the front ferroelectric layer 404 and a negative write voltage may be applied to the front gate electrode 410 to induce an upward polarization ($P_u$) in the front ferroelectric layer 404. The downward and upward polarizations are results of sheet immobile charge densities of opposite signs at the upper and lower interfaces of the front ferroelectric layer 404. The immobile charges are resulted from charged oxygen atoms that physically move in response to the positive and negative write voltages. The downward polarization ($P_d$) and the upward polarization ($P_u$) may increase or lower the threshold voltage of the channel in the semiconductor member 406. When a read voltage is applied at the back gate electrode 402, the read voltage may or may not be greater than the threshold voltage as it has shifted by the polarization. The difference states allow a read of the data stored in the third semiconductor device 400. The induced polarization is bi-stable (i.e., stable unless a write voltage is applied). Once the downward polarization or the upward polarization is written into the front ferroelectric layer 404, such polarization may retain in the front ferroelectric layer 404 without further power consumption at the front gate electrode 410.

In some implementations, the write voltage is greater than the read voltage. In some instances, a magnitude of the write voltage (including the positive write voltage and the negative write voltage) may be between about 1 volt (V) and about 6 V while the read voltage may be between about 0.3 V and about 2 V. In these embodiments, to ensure good cycle endurance, the front ferroelectric layer 404 includes a third thickness T3, which is between about 3 nanometer (nm) and about 100 nm. The semiconductor member 406 includes a fourth thickness T4, which is between about 2 nm and about 30 nm. According to the present disclosure, to ensure complete penetration of the electric field of the upward/downward polarization through the semiconductor member 406, the semiconductor member 406 is made to be thin. In this regard, the fourth thickness T4 of the semiconductor member 406 is smaller than the third thickness T3 of the front ferroelectric layer 404.

Figure 14:
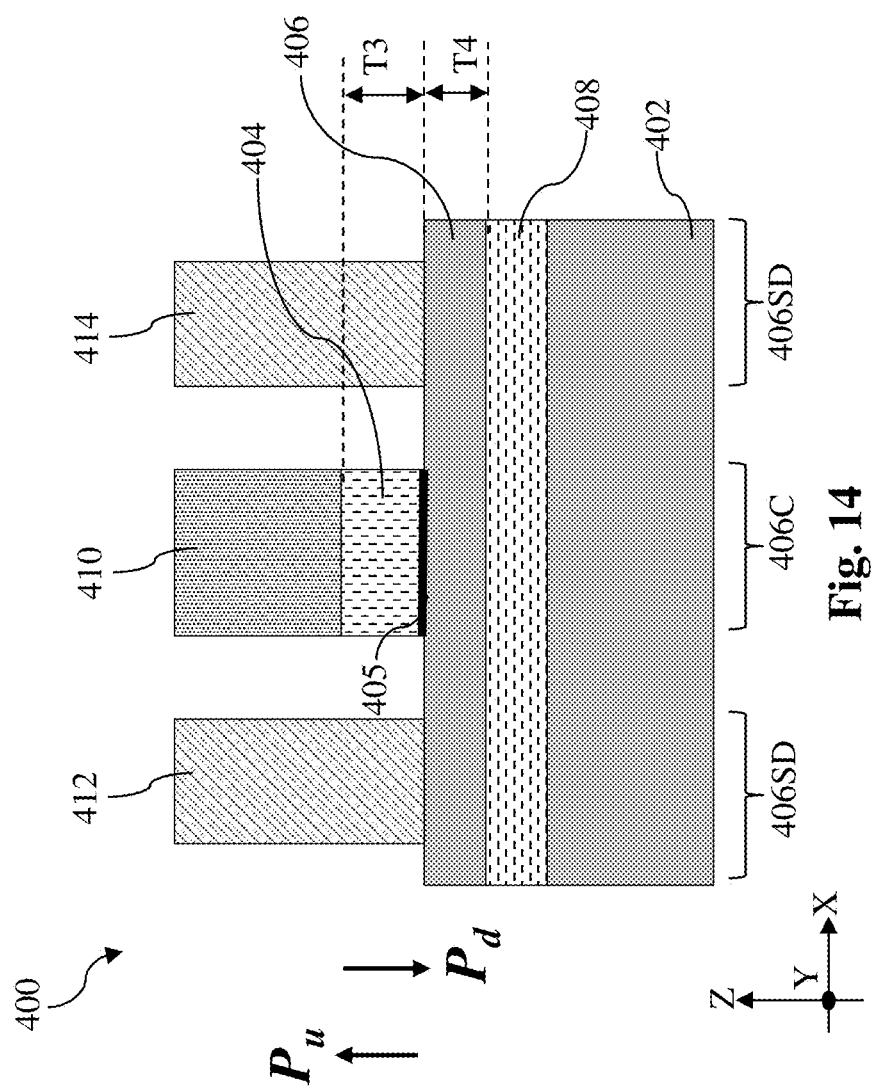
FIG. 14 illustrates a schematic cross-sectional view of an alternative semiconductor device, according to various aspects of the present disclosure.

In some embodiments represented in FIG. 14, the third semiconductor device 400 may include a capping layer 405 disposed between the front ferroelectric layer 404 and the semiconductor member 406. The capping layer 405 may be formed of silicon oxide or aluminum oxide and functions to prevent the polarization in the front ferroelectric layer 404 from impacting carrier mobility in the semiconductor member 406. In some instances, the capping layer 405 may have a thickness between about 1 nm and about 4 nm.

Figure 15:
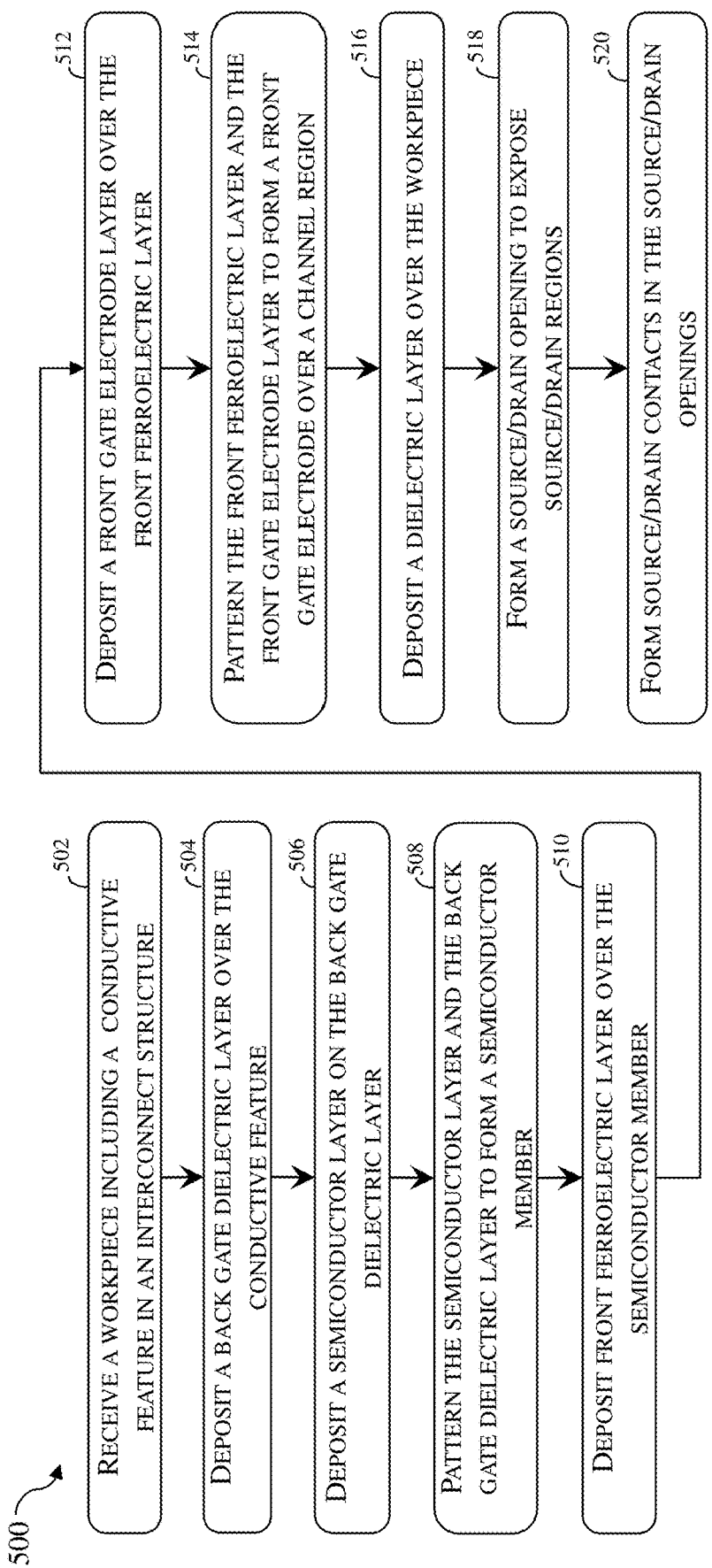
FIG. 15 is a flowchart of a method for fabricating a semiconductor device in FIG. 14, according to various aspects of the present disclosure.

FIG. 15 illustrates a flowchart of a method 500 for fabricating the third semiconductor device 400 in FIG. 14. Additional steps can be provided before, during, and after the method 500, and some of the steps described can be replaced or eliminated for other embodiments of the method 500. Operations of the method 500 may be better described in conjunction with FIGS. 16-24, which are fragmentary cross-sectional diagrammatic views of a workpiece 300 at various fabrication stages of a method, such as method 500 of FIG. 15. FIGS. 16-24 have been simplified for the sake of clarity to better understand the inventive concepts of the present disclosure. Additional features can be added in workpiece 300, and some of the features described below can be replaced, modified, or eliminated in other embodiments of workpiece 300.

Referring to FIGS. 15, 4 and 16, method 200 includes a block 502 where a workpiece 300 is received. The workpiece 300 in FIG. 4 has been described above and will not be repeated here. Similar to FIG. 5, FIG. 16 represents an enlarged view of the dotted rectangular area in FIG. 4. Because the features in FIG. 16 are similar to those described above with respect to FIG. 5, detailed description of FIG. 16 is omitted for brevity.

Referring to FIGS. 15 and 17, method 500 includes a block 504 where a back gate dielectric layer 602 is deposited over the conductive feature 3140. In some embodiments, the back gate dielectric layer 602 may include hafnium oxide, silicon oxide, aluminum oxide, or other suitable high-k dielectric material. The gate dielectric layer 320 may be deposited using ALD or CVD.

Referring to FIGS. 15 and 18, method 500 includes a block 506 where a semiconductor layer 604 is deposited over the back gate dielectric layer 602. In some embodiments, the semiconductor layer 604 may include silicon, gallium nitride, indium nitride, indium gallium nitride, indium gallium zinc oxide (IGZO), molybdenum disulfide, tungsten diselenide, or other suitable semiconductor material. In some implementations, the semiconductor layer 318 may be deposited using ALD or CVD. In some alternative implementations, an interfacial oxide layer (not shown in FIG. 18) is first deposited on the back gate dielectric layer 602 and the semiconductor layer 604 is deposited on the interfacial oxide layer. In some embodiments, the semiconductor layer 318 may be formed to a thickness between about 2 nm and about 30 nm. In some embodiments, a capping layer 605 may be deposited on the semiconductor layer 604 before the patterning of the semiconductor layer 604 and the back gate dielectric layer 602 at block 508. The capping layer 605 may be formed of silicon oxide or aluminum oxide and may be deposited using CVD or ALD.

Referring to FIGS. 15 and 19, method 500 includes a block 508 where the semiconductor layer 604 and the back gate dielectric layer 602 are patterned to form a semiconductor member 6040. Operations at block 508 may include photolithography processes and etch processes. In an example photolithography process, a hard mask may be deposited over the semiconductor layer 604. A photoresist layer is then deposited over the hard mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the hard mask layer. Then the semiconductor layer 604 and the back gate dielectric layer 602 are etched in an etch process using the patterned hard mask as an etch mask. In some instances, the etch process may be a dry etch process, such as a reactive ion etching (RIE) process. After the etch process, the semiconductor layer 604 and the back gate dielectric layer 602 are patterned into a semiconductor member 6040 and a patterned back gate dielectric layer 6020, respectively, as shown in FIG. 19. In the depicted embodiment, the semiconductor member 6040 and the ferroelectric feature 3160 are wider (along the X direction) than the underlying conductive feature 3140. Other embodiments are envisioned too. For example, the semiconductor member 6040 and the ferroelectric feature 3160 may be substantially coterminous with the underlying conductive feature 3140 along the X direction. In embodiments where the capping layer 605 is formed, the capping layer 605 is also patterned at block 514.

Referring to FIGS. 15 and 20, method 500 includes a block 510 where a front ferroelectric layer 606 is deposited over the semiconductor member 6040. In some embodiments, the front ferroelectric layer 606 may include hafnium zirconium oxide, gallium nitride, indium nitride, indium gallium nitride, aluminum scandium nitride, indium scandium nitride, gallium scandium nitride, barium titanate, ruthenium scandate, or other suitable ferroelectric material. In some embodiments, the front ferroelectric layer 606 may be deposited on the workpiece 300 using atomic layer deposition (ALD), physical vapor deposition (PVD), or chemical vapor deposition (CVD). In some implementations, measured from a top surface of the semiconductor member 6040, the ferroelectric layer 316 may be formed to a thickness between about 4 nm and about 100 nm.

Referring still to FIGS. 15 and 20, method 500 includes a block 512 where a front gate electrode layer 608 is deposited on the front ferroelectric layer 606. In some embodiments, the front gate electrode layer 608 may include tungsten, nickel, tantalum, titanium, aluminum, copper, cobalt, tantalum nitride, titanium nitride, ruthenium or other suitable conductive materials. The front gate electrode layer 608 may be deposited using PVD, CVD, or MOCVD.

Referring to FIGS. 15 and 21, method 500 includes a block 514 where the front gate electrode layer 608 and the front ferroelectric layer 606 are patterned to form a front gate electrode 6080 over a channel region 6040C of the semiconductor member 6040. Operations at block 514 may include photolithography processes and etch processes. In an example photolithography process, a hard mask may be deposited over the front gate electrode layer 608. A photoresist layer is then deposited over the hard mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the hard mask layer. Then the front gate electrode layer 608 and the front ferroelectric layer 606 are etched in an etch process using the patterned hard mask as an etch mask. In some instances, the etch process may be a dry etch process, such as a reactive ion etching (RIE) process. After the etch process, the front gate electrode layer 608 and the front ferroelectric layer 606 are patterned into a front gate electrode 6080 and a front ferroelectric feature 6060, respectively, as shown in FIG. 20. The front gate electrode 6080 and the front ferroelectric feature 6060 are disposed in a channel region 6040C of the semiconductor member 6040. The channel region 6040C are disposed between two source/drain regions 6040SD.

Referring to FIGS. 15 and 22, method 500 includes a block 516 where a dielectric layer 610 is deposited over the workpiece 300. In some embodiments, the dielectric layer 610 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), silicon oxide, and/or other suitable dielectric materials. The dielectric layer 610 may be deposited by spin-on coating or CVD. In some embodiments not explicitly shown, a dielectric barrier layer may be conformally deposited on to surfaces and/or sidewalls of the front gate electrode 6080, the front ferroelectric feature 6060, the semiconductor member 6040, and the back gate dielectric layer 6020 before deposition of the dielectric layer 610. The dielectric barrier layer functions to maintain the integrity of the front gate electrode 6080 by preventing oxygen diffusion into the front gate electrode 6080 or metal out diffusion into the dielectric layer 610. Like the intermetal dielectric layer 304 and the dielectric layer 324, the dielectric layer 610 is also an intermetal dielectric (IMD) layer as further metal layers of the interconnect structure 340 may be formed over the dielectric layer 610.

Referring to FIGS. 15 and 23, method 500 includes a block 518 where a source/drain opening 612 are formed in the dielectric layer 610 to expose a source/drain region 6040SD of the semiconductor member 6040. Operations at block 518 may include photolithography processes and etch processes. In an example photolithography process, a hard mask may be deposited over the dielectric layer 610. A photoresist layer is then deposited over the hard mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the hard mask layer. Then the dielectric layer 610 is anisotropically etched in an etch process using the patterned hard mask as an etch mask to form the source/drain openings 612. In some instances, the etch process may be a dry etch process, such as a reactive ion etching (RIE) process. While not explicitly shown, operations at block 518 may be combined with formation of contact via openings to other conductive features in the third metal line layer 314 shown in FIG. 4.

Figure 24:
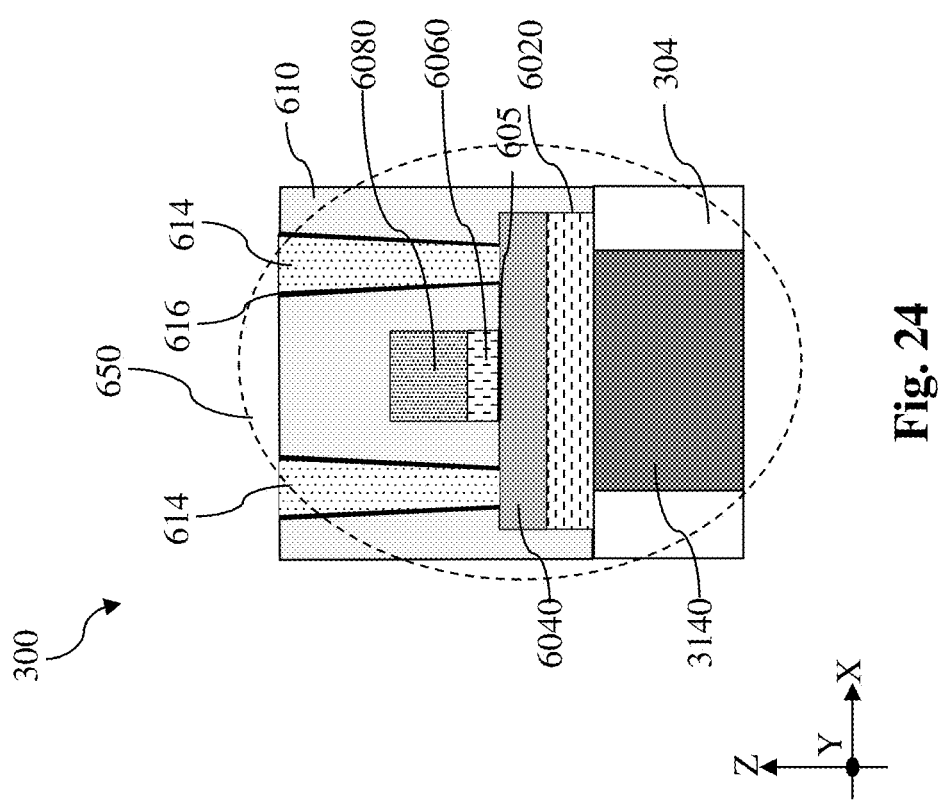

Referring to FIGS. 15 and 24, method 500 includes a block 520 where a source/drain contact 614 is formed in the source/drain opening 612. In some embodiments, the source/drain contact 614 may include tungsten, nickel, tantalum, titanium, aluminum, copper, cobalt, tantalum nitride, titanium nitride, ruthenium or other suitable conductive materials. The source/drain contact 614 may be formed using PVD or a combination of PVD and electroplating or PVD and electroless plating. In the embodiments represented in FIG. 24, the source/drain contact 614 may be isolated from the dielectric layer 610 by a barrier layer 616. The barrier layer 616 may be formed of tantalum, tantalum nitride, tantalum carbide, titanium, titanium nitride, titanium carbide, and other suitable material that can block oxygen diffusion. While not explicitly shown, in some implementations, a silicide feature may be formed at the interface between the source/drain contact 614 and the semiconductor member 6040. The silicide feature is formed by depositing a metal layer on the source/drain regions 6040SD exposed in the source/drain openings 612. The metal layer includes any material suitable for promoting silicide formation, such as nickel, titanium, cobalt, tantalum, other suitable metal, or combinations thereof. The workpiece 300 is then heated (for example, subjected to an annealing process) to cause a silicidation reaction between with the metal and the semiconductor member 6040. The silicide layer may include nickel silicide, titanium silicide, tantalum silicide, or cobalt silicide. Any un-reacted metal, such as remaining portions of the metal layer, is selectively removed by any suitable process, such as an etching process.

Reference is still made to FIG. 24, upon conclusion of the operations at block 520, a second BSFFET 650 is substantially formed. The second BSFFET 650 may correspond to the third semiconductor device 400 in FIG. 14. For example, the back gate dielectric layer 6020 may correspond to the back gate dielectric layer 408 in FIG. 14; and the front ferroelectric feature 6060 may correspond to the front ferroelectric layer 404 in FIG. 14. Because the operation of the second BSFFET 650 is similar to that of the third semiconductor device 400, description of the operations of the second BSFFET 650 is omitted for brevity.

Embodiments of the present disclosure provide advantages. For example, the present disclosure provides embodiments of BSFFETs. A BSFFET of the present disclosure has a ferroelectric layer separated from a gate dielectric layer by the channel. The ferroelectric layer is disposed between a first gate electrode and the channel while the gate dielectric layer is disposed between a second gate electrode and the channel. With separation of the ferroelectric layer and the gate dielectric layer, the ferroelectric layer and the gate dielectric layer do not compete for space and semiconductor devices of the present disclosure may have a satisfactory thickness for the ferroelectric layer and a satisfactory thickness for the gate dielectric layer at the same time. The semiconductor device of the present disclosure has two gates and may be used as a non-volatile memory device. When used as a non-volatile memory device, one of the two gates is dedicated to WRITE operations and the other is dedicated to READ operations.

The present disclosure provides for many different embodiments. In one embodiment, a semiconductor device is provided. The semiconductor device includes a first gate electrode, a ferroelectric insulating layer over the first gate electrode, a semiconductor member over the ferroelectric insulating layer, a gate dielectric layer over the semiconductor member, and a second gate electrode over the gate dielectric layer.

In some embodiments, a composition of the ferroelectric insulating layer is different from a composition of the gate dielectric layer. In some implementations, the ferroelectric insulating layer includes hafnium zirconium oxide, gallium nitride, indium nitride, indium gallium nitride, aluminum scandium nitride, indium scandium nitride, gallium scandium nitride, barium titanate, or ruthenium scandate. In some instances, the gate dielectric layer includes hafnium oxide, silicon oxide, or aluminum oxide. In some embodiments, the semiconductor member includes silicon, gallium nitride, indium nitride, indium gallium nitride, indium gallium zinc oxide (IGZO), molybdenum disulfide, or tungsten diselenide. In some implementations, the semiconductor device further includes a capping layer disposed between the ferroelectric insulating layer and the semiconductor member and the capping layer includes silicon oxide or aluminum oxide. In some embodiments, the semiconductor member includes a channel region and a source/drain region and the gate dielectric layer and the second gate electrode are disposed directly over the channel region. In some implementations, the semiconductor device may further include a source/drain contact disposed over and in contact with the source/drain region of the semiconductor member.

In another embodiment, a structure is provided. The structure includes a conductive feature disposed in a dielectric layer, a ferroelectric insulating layer over the conductive feature, a semiconductor member over the ferroelectric insulating layer, wherein the semiconductor member includes a channel region and a source/drain region aligned along a direction, a gate dielectric layer over the semiconductor member, and a gate electrode over the gate dielectric layer.

In some embodiments, the conductive feature includes a first width along the direction and the ferroelectric insulating layer includes a second width along the direction. The second width is greater than the first width. In some implementations, the structure may further include a first plurality of conductive lines in the dielectric layer and an interconnect layer disposed below the dielectric layer and including a second plurality of conductive lines. In some embodiments, a composition of the ferroelectric insulating layer is different from a composition of the gate dielectric layer. In some instances, the gate dielectric layer includes hafnium oxide, silicon oxide, or aluminum oxide. In some embodiments, the semiconductor member includes silicon, gallium nitride, indium nitride, indium gallium nitride, indium gallium zinc oxide (IGZO), molybdenum disulfide, or tungsten diselenide. In some instances, the ferroelectric insulating layer includes a first thickness and the semiconductor member includes a second thickness smaller than the first thickness.

In another embodiment, a method is provided. The method includes providing an interconnect structure having a conductive feature embedded in a dielectric layer, forming a ferroelectric insulating layer on the top conductive feature, depositing a semiconductor layer over the ferroelectric insulating layer, depositing a gate dielectric layer over of the semiconductor layer, and forming a gate electrode layer on the gate dielectric layer.

In some embodiments, the method may further include after the depositing of the ferroelectric insulating layer, depositing a capping layer directly on the ferroelectric insulating layer. In some embodiments, the method may further include after the depositing of the gate electrode layer, patterning the gate dielectric layer and the gate electrode layer to form a gate structure over a channel region of the semiconductor layer. In some implementations, the ferroelectric insulating layer includes hafnium zirconium oxide, gallium nitride, indium nitride, indium gallium nitride, aluminum scandium nitride, indium scandium nitride, gallium scandium nitride, barium titanate, or ruthenium scandate. In some instances, the semiconductor layer includes silicon, gallium nitride, indium nitride, indium gallium nitride, indium gallium zinc oxide (IGZO), molybdenum disulfide, or tungsten diselenide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing an interconnect structure comprising a conductive feature embedded in a dielectric layer, top surfaces of the conductive feature and the dielectric layer being coplanar;
    forming a ferroelectric insulating layer on the top surface of the conductive feature and on the top surface of the dielectric layer;
    depositing a semiconductor layer over the ferroelectric insulating layer;
    depositing a gate dielectric layer over the semiconductor layer; and
    forming a gate electrode layer on the gate dielectric layer.

2. The method of claim 1, further comprising:
    after the depositing of the ferroelectric insulating layer, depositing a capping layer directly on the ferroelectric insulating layer.

3. The method of claim 1, further comprising:
    after the depositing of the gate electrode layer, patterning the gate electrode layer and the gate dielectric layer to form a gate structure over a channel region of the semiconductor layer.

4. The method of claim 3, further comprising:
    after patterning the gate electrode layer and the gate dielectric layer, depositing a second dielectric layer directly on the gate structure and directly on the semiconductor layer; and
    etching the second dielectric layer to form source/drain (S/D) openings in the second dielectric layer, and the S/D openings expose S/D regions of the semiconductor layer.

5. The method of claim 4, further comprising:
    forming S/D contacts in the S/D openings, wherein the S/D contacts are insulated from the gate structure by the second dielectric layer.

6. The method of claim 1, wherein the ferroelectric insulating layer comprises hafnium zirconium oxide, gallium nitride, indium nitride, indium gallium nitride, aluminum scandium nitride, indium scandium nitride, gallium scandium nitride, barium titanate, or ruthenium scandate.

7. The method of claim 1, wherein the semiconductor layer comprises silicon, gallium nitride, indium nitride, indium gallium nitride, indium gallium zinc oxide (IGZO), molybdenum disulfide, or tungsten diselenide.

8. The method of claim 1, further comprising patterning:
    patterning the semiconductor layer to form a semiconductor member, wherein sidewalls of the semiconductor member are coterminous with sidewalls of the ferroelectric insulating layer.

9. A method, comprising:
    receiving an interconnect structure having a conductive feature embedded in a dielectric layer;
    forming a ferroelectric layer directly on top surfaces of the conductive feature and the dielectric layer;
    depositing a semiconductor layer directly on the ferroelectric layer;
    patterning the semiconductor layer to form a semiconductor member having a channel region and source/drain (S/D) regions adjacent the channel region along a direction;
    depositing a gate dielectric layer directly on the channel region of the semiconductor member; and
    forming a gate electrode layer directly on the gate dielectric layer.

10. The method of claim 9,
    wherein the conductive feature comprises a first length along the direction,
    wherein, after the patterning, the semiconductor member has a second length along the direction,
    wherein the second length is greater than the first length.

11. The method of claim 9, wherein the patterning of the semiconductor layer comprises patterning the ferroelectric layer.

12. The method of claim 9, wherein the depositing of the gate dielectric layer comprises depositing the gate dielectric layer on sidewalls of the semiconductor member and sidewalls of the ferroelectric layer.

13. The method of claim 9, wherein the ferroelectric layer comprises hafnium zirconium oxide, gallium nitride, indium nitride, indium gallium nitride, aluminum scandium nitride, indium scandium nitride, gallium scandium nitride, barium titanate, or ruthenium scandate.

14. The method of claim 13, wherein a composition of the ferroelectric layer is different from a composition of the gate dielectric layer.

15. The method of claim 9, wherein the semiconductor layer comprises silicon, gallium nitride, indium nitride, indium gallium nitride, indium gallium zinc oxide (IGZO), molybdenum disulfide, or tungsten diselenide.

16. The method of claim 9, wherein a thickness of the semiconductor member is smaller than a thickness of the ferroelectric layer.

17. A method, comprising:
    receiving a substrate having a first gate electrode over the substrate;
    forming a ferroelectric layer over the first gate electrode;
    forming a capping layer over the ferroelectric layer;
    forming a semiconductor member over the capping layer;

forming a gate dielectric layer over the semiconductor member; and forming a second gate electrode directly on the gate dielectric layer, wherein a channel region of the semiconductor member is directly contacting and directly in between the ferroelectric layer and the gate dielectric layer.

18. The method of claim 17, wherein sidewalls of the semiconductor member are coterminous with sidewalls of the ferroelectric layer.

19. The method of claim 17, wherein the capping layer comprises silicon oxide or aluminum oxide.

20. The method of claim 17, wherein the ferroelectric layer comprises hafnium zirconium oxide, gallium nitride, indium nitride, indium gallium nitride, aluminum scandium nitride, indium scandium nitride, gallium scandium nitride, barium titanate, or ruthenium scandate.

* * * * *